United States Patent [19]

Harte

[11] Patent Number: 4,694,178

[45] Date of Patent: Sep. 15, 1987

[54] MULTIPLE CHANNEL ELECTRON BEAM OPTICAL COLUMN LITHOGRAPHY SYSTEM AND METHOD OF OPERATION

[75] Inventor: Kenneth J. Harte, Carlisle, Mass.

[73] Assignee: Control Data Corporation, Minneapolis, Minn.

[21] Appl. No.: 749,796

[22] Filed: Jun. 28, 1985

[51] Int. Cl.$^4$ .................. G21K 1/08; H01J 3/14; H01J 3/26

[52] U.S. Cl. .................. 250/396 R; 250/398; 250/492.2

[58] Field of Search .......... 250/396 R, 396 ML, 398, 250/492.2; 313/361.1

[56] References Cited

U.S. PATENT DOCUMENTS

| | | | |
|---|---|---|---|
| 3,491,236 | 1/1970 | Newberry | 250/307 |
| 4,151,422 | 4/1979 | Goto et al. | 250/492.2 |
| 4,200,794 | 4/1980 | Newberry et al. | 250/396 ML |
| 4,213,053 | 7/1980 | Pfeiffer | 250/492.2 |
| 4,390,789 | 6/1983 | Smith et al. | 250/492.2 |
| 4,465,934 | 8/1984 | Westerberg et al. | 250/492.2 |

Primary Examiner—Bruce C. Anderson
Attorney, Agent, or Firm—Charles W. Helzer

[57] ABSTRACT

The invention provides an improved direct-write/read charged particle beam lithography/readout system employing multiple channel charged particle beam optical columns wherein a plurality of individually controlled, single deflector stage charged particle beam optical columns are operated in parallel to simultaneously write or read the same or complementary semiconductor device microcircuit patterns on a plurality of different target areas of a semiconductor target wafer whereby considerably increased thru-put of a microcircuit fabrication facility is achieved.

39 Claims, 12 Drawing Figures

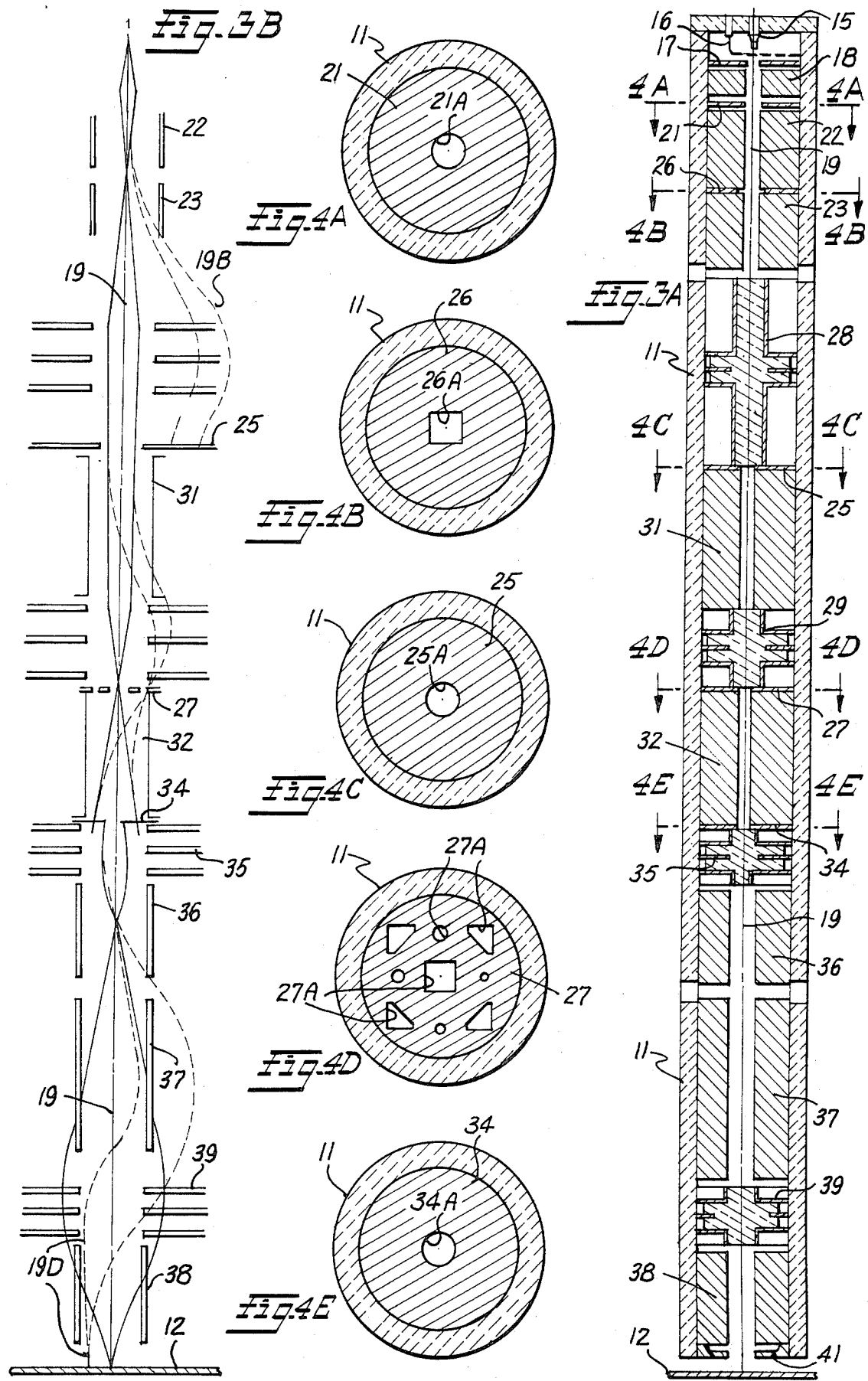

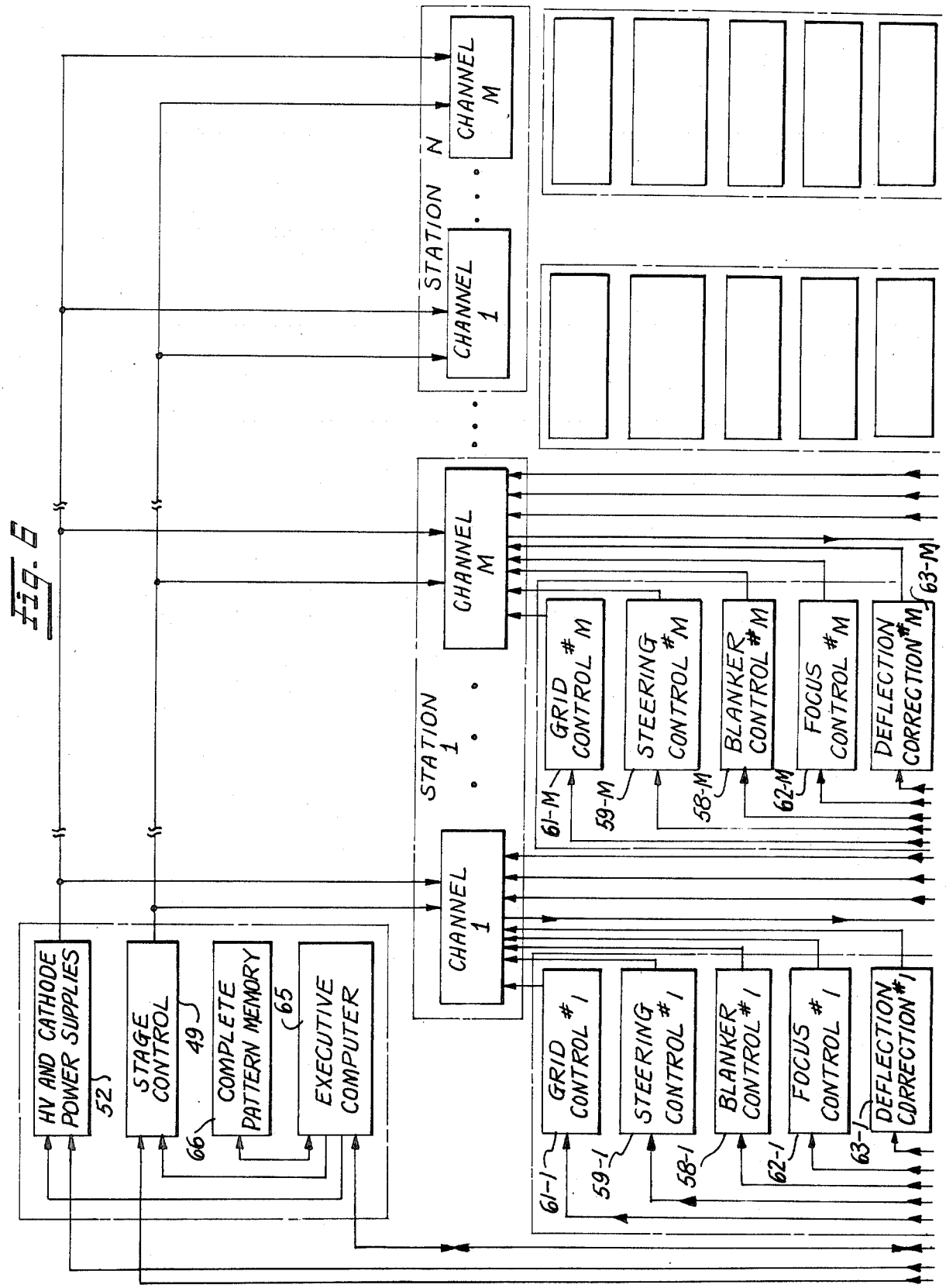

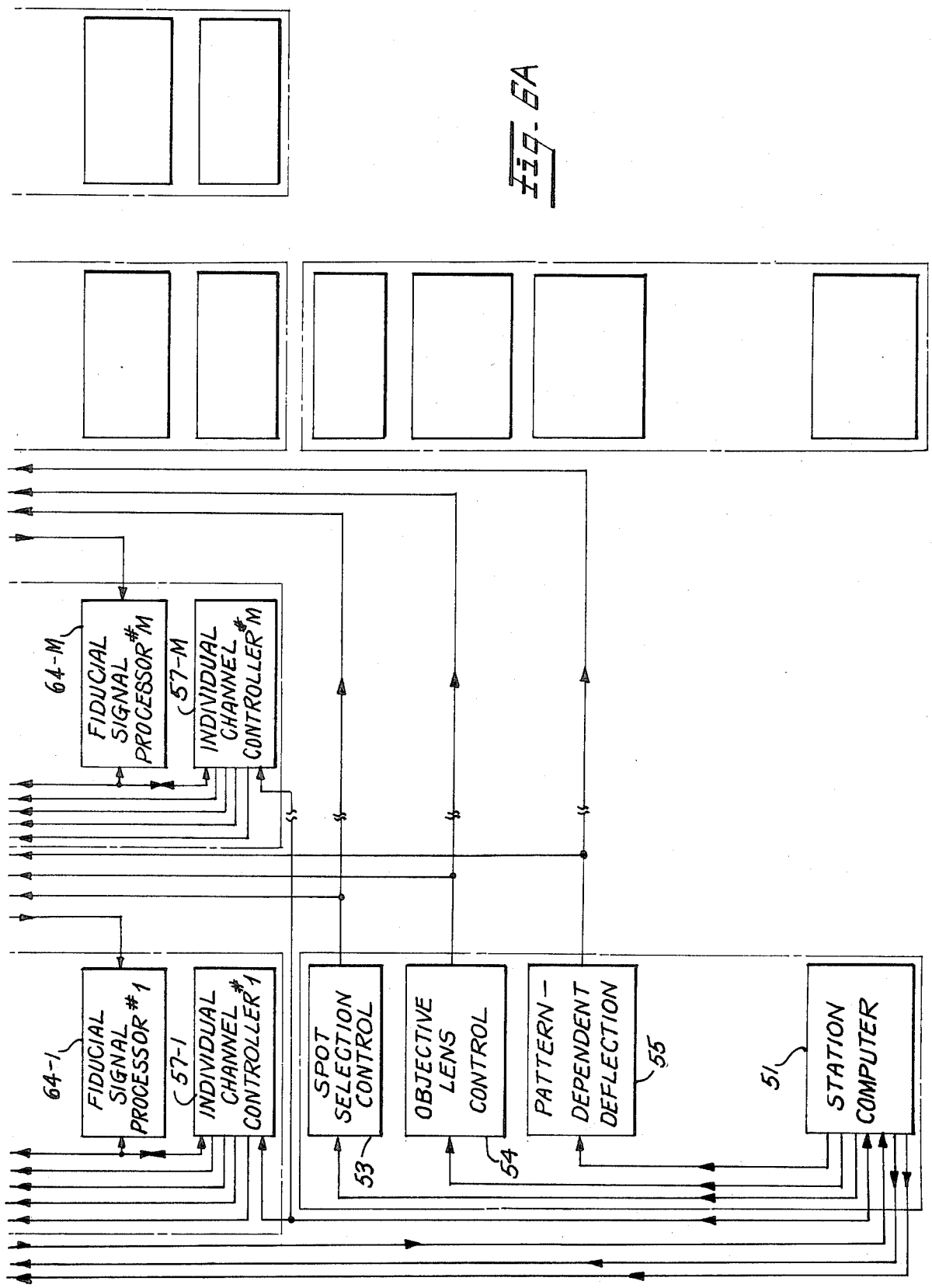

MULTIPLE CHANNEL ELECTRON BEAM OPTICAL COLUMN LITHOGRAPHY SYSTEM AND METHOD OF OPERATION

TECHNICAL FIELD

This invention relates to an improved method and apparatus for high speed, high resolution electron beam lithography/readout used for direct electron beam writing/readout of semiconductor device targets such as circuit pattern writing and fiducial signal readout on a semiconductor target wafer in the fabrication of electronic microcircuit devices.

BACKGROUND OF INVENTION

Direct-write/read electron-beam lithography of semiconductor device circuit patterns on a semiconductor target wafer in the fabrication of microcircuit devices offers a number of advantages over photon beam (optical or x-rays) methods. These advantages include more accurate edge placement and pattern overlay, elimination of the need for masks or reticles, and higher resolution. However, known electron-beam lithography machines employing a single electron beam are at least 5 to 10 times slower than current optical exposure stations, basically because of the serial nature of the known electron-beam lithography exposure techniques compared with the parallel nature of optical exposure of the semiconductor device circuit patterns through a mask or reticle. Therefore an electron-beam lithography system and method is needed which exposes more than a single location serially of a semiconductor circuit pattern by direct electron beam writing.

A multi-channel electron-beam lithography system previously has been described in U.S. Pat. No. 4,390,789 issued June 28, 1983 to Donald O. Smith and Kenneth J. Harte for an "Electron Beam Array Lithography System". This known patented system employs a plurality of individually controlled double-deflection electron beam optical columns (also known as a compound, or fly's eye, or matrix lens optical column). In this known system the electron beam in each column is first deflected by a coarse deflector to a single selected fine (fly's eye) lens and fine deflector sub-assembly with each such fine lens and fine deflector sub-assembly being serially accessed by the electron beam via the coarse deflector. The double deflection system thus comprised is relatively low in current density, complex in construction, expensive and has the additional disadvantage of producing a beam with a relatively large angle from the normal to the wafer surface at the edges of the fine deflection fields.

SUMMARY OF INVENTION

It is a primary object of the present invention to provide a new and improved multi-channel electron beam optical column lithography system and method of operation wherein a plurality of individually controlled, single deflector stage electron beam optical columns are operated in parallel to simultaneously write the same or complementary semiconductor device circuit patterns on a plurality of different target areas of a semicondutor target wafer whereby considerably increased thru-put of micro circuits is achieved using direct electron beam writing on a target wafer surface.

Another object of the invention is to provide a novel, miniaturized single electron beam optical column which is all electrostatic in its operation and sufficiently small in size to be clustered with other similar columns over a semiconductor target wafer and allows simultaneous, parallel direct electron beam writing on different surface areas of the semiconductor wafer to thereby provide increased thru-put in the manufacture of microcircuit devices.

Still another object of the invention is to provide novel, miniaturized all electrostatic, single deflection stage electron beam optical columns having the characteristics set forth in the preceeding paragraph and having novel focus and deflection sections which permit, among other things, both independent control of deflection of the single electron beam over the field of view of each column so as to cover about a 1-2 millimeter square area, and also provides orthogonal landing of the deflected electron beam of each column onto the target surface within 0.2 milliradians.

A further object of the invention is to provide a novel miniaturized, all electrostatic, single deflection stage electron beam column having the above characteristics which further includes a novel electron beam sizing/shaping sub-assembly for individually sizing and shaping the cross sectional area of the writing electron beam to conform the size and shape of the beam to the requirements of a specific area of a target surface upon which the electron beam is directed.

A still further object of the invention is to provide a device having the above set forth characteristics which is entirely general in its application and can be used in the control and direct writing and reading with charged particles other than electrons such as positive or negative ions.

In practicing the invention, a novel electrostatic electron beam optical column is provided for use in multichannel electron-beam lithography systems. The electron beam optical column comprises an electron gun mounted at one end of an elongated housing having a target surface supported at the opposite end. An electrostatic electron beam spot-shaping sub-assembly is mounted within the elongated housing in the direction of the target surface along the optical axis of the undeflected electron beam path for the purpose of specifically shaping the cross sectional area of the electron beam of the individual channel to the specific requirements of a selected target surface on which the beam will be directed. The electrostatic electron beam spot-shaping sub-assembly includes first and second spot-shaping apertured plate members separated by a first spot-shaping electrostatic deflector for imaging the aperture of the first spot-shaping apertured plate member onto the second spot-shaping apertured plate member to thereby produce a partially truncated image of the aperture of the first spot-shaping apertured plate for application to the target surface. A second spot-shaping electrostatic deflector is provided following the second spot-shaping apertured plate member for restoring the partially truncated electron image of the first spot-shaping aperture back to the optical center axis of the undeflected electron beam path to thereby avoid the need to correct the electron beam spot position at the target surface as the electron beam shape is varied. An electrostatic condenser lens is positioned in the elongated housing intermediate the second spot-shaping electrostatic deflector and the target surface for demagnification of the shaped electron beam spot to allow for physically shortening the overall length of the electrostatic electron beam optical column. A spot-positioning electrostatic deflector is mounted intermediate the electrostatic condenser lens and the target surface and comprises a three-stage octopole deflector having first, second and third octopole deflector sections arrayed axially in the order named along the optical axis of the electron beam optical column and alternately supplied with deflection voltages and correction voltages. An objective lens is positioned ahead of the third and following the first and second octopole deflector sections whereby the central rays of the shaped electron beam as they enter the combined three-stage octopole deflector and objective lens system in the path towards the target surface are caused by the first and second octopole deflector sections to pass through the center of the objective lens at an angle proportional to the desired deflection. Thereafter, the thus deflected rays pass through the third octopole deflection section and exit at a point spaced from the center axis of the undeflected electron beam path by a distance proportional to the desired deflection and on a path orthogonal to the target surface.

The invention further comprises electron beam blanking deflection electrode means mounted within the elongated housing between the electron gun and the electrostatic electron beam spot-shaping sub-assembly for selectively turning the electron beam produced by the electron beam column on and off when desired. In addition, a steering deflector sub-assembly is mounted in the elongated housing between the electron gun and the electrostatic electron beam spot-shaping sub-assembly for deflecting and centering the electron beam produced by the electron gun onto the optical axis of the electron beam optical column prior to entering the electron beam spot-shaping sub-assembly.

A multiple channel electron beam optical column lithography system is provided by arranging a plurality of single electron beam optical columns constructed as described in the preceeding paragraphs in a common evacuated housing structure which supports all of the electron beam optical columns over selected unique areas of a common target surface with the undeflected electron beam path optical axes of all of the electron beam optical columns arranged in parallel with each other and orthogonal to the target surface. A movable stage physically supports the common target surface which may comprise a relatively large diameter (for example, 150 millimeters) semiconductor target wafer, at the electron beam output end of the electron beam optical columns with a unique target area of the semiconductor target wafer adjacent the electron beam output end of the respective electron beam optical columns. The system is completed by a controller for controllably moving the movable stage along at least one axis of movement which is transverse to the undeflected electron beam optical axes of the plurality of electron beam optical columns.

In a preferred embodiment of the multiple channel electron beam optical column lithography system, the system further includes a control system for automatically controlling the electron beam lithography performed on the selected target areas of the common target surface by the multiple electron beam optical columns. This control system includes a master (station) system control computer, common high voltage and cathode power supply, common spot selection control circuitry, common pattern-dependent deflection control circuitry, common objective lens and dynamic focus control circuitry and a master movable stage monitoring and control together with a plurality of individual channel controller sub-systems for individually controlling each channel in accordance with the unique operating characteristics of the individual channels.

The invention further includes a method of operating a multiple channel electron beam optical column lithography system constructed in the above described manner wherein the method comprises mounting a large diameter semiconductor wafer as the target surface on the movable stage with preselected surface areas of the target wafer being disposed under the electron beam output end of respective ones of the plurality of electron beam optical columns. The method further includes evacuating the common evacuated housing structure for all of the columns, electron beam writing on each of the preselected surface areas in the same semiconductor device patterns for all of the target wafers by operating the electron beam optical columns in parallel using a master pattern deflection control common to all of the electron beam optical columns under the control of a master (station) control computer commonly controlling all of the electron beam optical columns. Electron beam writing is coordinated with the movement of the selected target wafer areas by the movable stage control mechanism which supports the target wafer so as to achieve a vector scan write-on-the-fly mode of electron beam writing. The common pattern to be written on the respective target areas is segmented into stripes, which in turn are broken into subfields within which the pattern is divided into trapezoidal areas; within each trapezoidal area the electron beam spot size and shape of each electron beam optical column is dynamically adjusted so as to accomplish electron beam writing on the selected target areas of the entire target wafer surface in a minimum of time.

In the method of operation described in the preceeding paragraph, certain control functions are shared in common across all of the electron beam channels including the master system control computer, high voltage and cathode power supply, spot selection control, pattern-dependent deflection control, dynamic focus control and movable stage movement monitoring and control and wherein other control functions are supplied separately to the individual electron beam columns including separate electron beam channel control under the supervision of the master station computer by a unique electron beam channel controller for each respective electron beam channel, electron beam blanking control for each respective channel, electron beam steering control for each channel, electron grid gun control for each respective channel, electron beam spot focus control and correction for each channel, electron beam deflection correction for each channel and fiducial signal sensing and processing for each respective channel.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters and wherein:

FIG. 3A is a longitudinal sectional view showing the internal construction of a single one of the electron beam optical channels employed in the system of FIG. 1;

FIGS. 3B is a schematic functional diagram of an electron beam optical channel such as shown in FIG. 3A and illustrates schematically the manner of operation of the single electron beam channel;

FIGS. 4A-4E are cross sectional views taken transverse to the optical axis of the single deflection stage electron beam optical channel shown in FIG. 3A taken through the respective sections indicated by the corresponding figure numbers, with the aperture shapes shown in enlarged scale relative to the housing 11 for visibility;

FIG. 6 is a functional block diagram of a portion of an enlarged control system for controlling a number of stations, such as that shown in FIG. 5, and illustrates the interconnection of the individual station elements and their control by an individual station computer together with the relation of the individual station computers to a common system executive computer connected to all of the station computers in the overall multi-station electron beam lithography system; and FIG. 6A is a functional block diagram which is interconnected to the block diagram of FIG. 6 and completes the illustration of the enlarged multiple station control system while viewed in conjunction with FIG. 6.

BEST MODE OF PRACTICING THE INVENTION

Multiple Channel Electron Beam Lithography System

Figure 1:
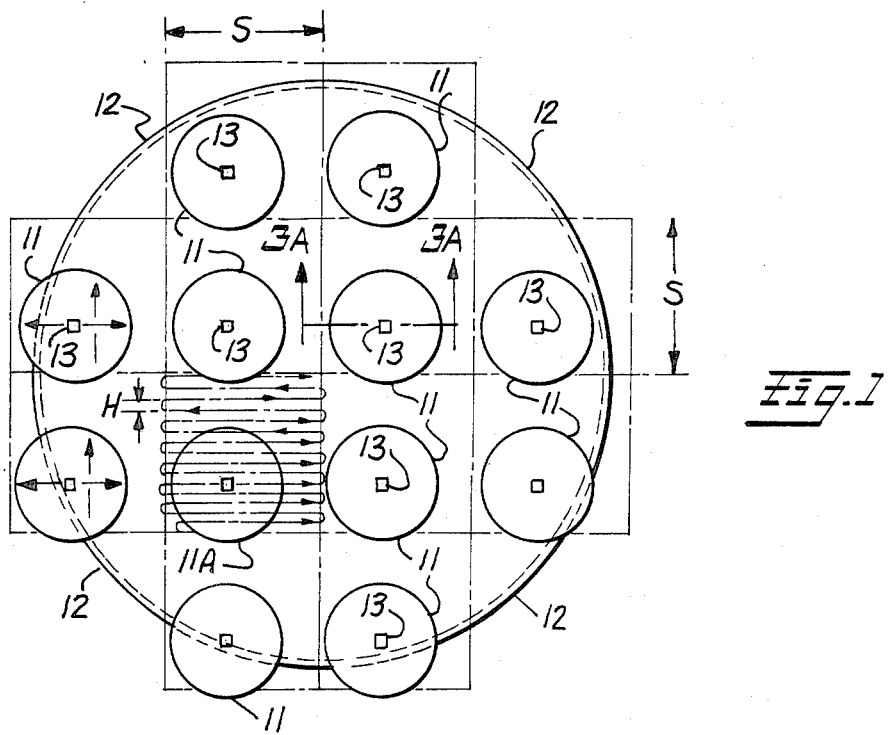
FIG. 1 is an overall plan view of a multiple channel electron beam optical column lithography system constructed according to the invention.

FIG. 1 is a geometric plan view of the layout of a specific multi-channel electron beam optical column lithography system according to the invention wherein there are 12 separate, miniaturized, single electron beam optical columns shown at 11. The columns 11 are mounted within a common evacuated housing structure (not shown) that supports all of the electron beam optical columns 11 in an array with each column over a selected unique area of a common target surface shown at 12 in FIG. 1. The target surface 12 shown in FIG. 1 comprises a circular semiconductor target wafer of about 150 millimeters in diameter which is supported on a movable stage (to be described more fully hereinafter) capable of moving the target wafer within a planar x-y area lying within the plane of the drawing. The details of construction and operation of each of the miniaturized electron beam optical columns 11, which are about 30 millimeters in diameter, will be described more fully hereafter with relation to FIGS. 3A, 3B and 4A-4E of the drawings. Each electron beam optical column 11 forms a separate channel that is fixed in space relative to the movable target surface 12 and possesses a restricted field of view shown at 13 over an area of about 1-2 millimeters square. This field of view 13 of each electron optical column 11 is due to the inclusion of a limited deflection capability within each electron column as will be described hereafter.

Figure 2:
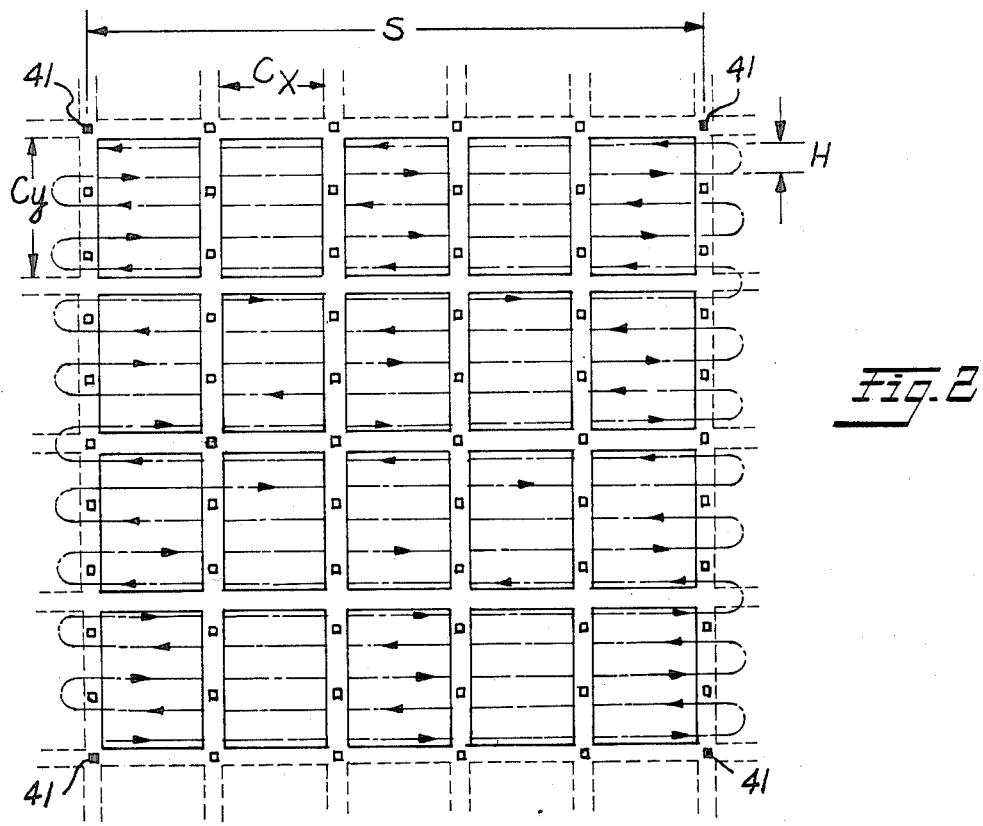
FIG. 2 is an enlarged plan view of the target surface of one of the single deflector stage electron beam channels comprising a part of the system of FIG. 1 and illustrates the manner in which direct electron beam writing on the target surface portion is achieved by a vector scan using the single deflection stage electron beam channel having limited deflection capabilitity in conjunction with movement of the movable stage supporting the target surface.

Direct electron beam writing on a unique, square segmental area of the surface of the semiconductor target wafer 12 is achieved in a vector scan write-on-the-fly mode of operation. As best seen in FIG. 2 of the drawings, the overall field of view S of each electron beam optical column 11 is broken up into chip fields of typically several millimeters square as indicated at Cx and Cy in FIG. 2. Within the chip fields the semiconductor chip circuit pattern to be written is segmented into stripes of height H equal to or less than the Y-deflection field of the electron beam columns. The stripes in turn, are broken into subfields which are of the order of 50 micrometers square. Within each subfield the circuit pattern to be written is divided into trapezoids and within each trapezoid the spot size and shape of the electron beam at any point within the sub-field is dynamically adjustable so as to accomplish writing of the pattern in minimum time. During operation, all 12 electron beam channels 11 are programmed to write the same pattern in parallel simultaneously so that the thruput of the overall electron beam lithography system is greatly increased over prior art, serially operated electron beam writers.

To provide adjustability to the electron beam spot size and shape of each electron beam optical column 11 in order for it to carry out the above briefly described vector scan mode of operation, as well as to allow dynamic deflection of the shaped and sized electron beam within the limited 1-2 millimeter square field of view indicated at 13, a radically different and novel, all-electrostatic electron beam optical column design is provided.

Miniaturized, All-Electrostatic Electron Beam Optical Column

The construction of the novel electron beam optical columns 11 is shown in greater detail in FIGS. 3A, 3B and 4A-4E. Each of the electron beam optical columns 11 is all-electrostatic and is capable of covering a 1-2 millimeter square field of view with a beam convergent half-angle of 6-7 milliradians while the writing electron beam produced by the column simultaneously is dynamically adjusted in spot shape and spot size. The design is such that even while deflected, the writing electron beam orthogonally lands on the target surface to which it is deflected within 0.2 milliradians and with an edge width, or total aberration equal to or less than 0.1 micrometers. This performance exceeds that of any known all-electrostatic optical column by a factor of 2-4 in achievable current density and is only a factor of 2 below the best known magnetic electron optical systems. It should be noted at this point in the disclosure, however, that magnetic electron optical columns are not suitable for multi-channel parallel electron beam lithography systems such as that illustrated in FIG. 1 because the relatively large diameter of the magnetic electron optical column precludes them being clustered over relatively small diameter semiconductor target wafers having a diameter of about 150 millimeters such as that depicted at 12 in FIG. 1.

The details of construction of an all-electrostatic electron beam optical column manufactured according to the invention are illustrated in FIGS. 3A and 4A–4E, and the manner of operation of the novel, all-electrostatic optical columns is illustrated in the schematic functional diagram of FIG. 3B. As shown in FIG. 3A each electron beam optical column or channel is comprised by an outer elongated cylindrical housing member 11 preferably fabricated from a ceramic such as alumina, but may be formed from other insulating material. The electron optical sub-assemblies supported within housing 11 consists of three main sections which are further described in detail below and are comprised by an electron gun sub-assembly, an electron beam spot size and shaping sub-assembly, and an electron beam spot imaging and deflection sub-assembly. A preferred method of fabrication of these sub-assemblies, the mounting and aligning of the sub-assemblies within the elongated housing member 11 and the manner of excitation with suitable electric power and control signals is described more fully in a co-pending U.S. application Ser. No. 749,792, filed June 28, 1985 concurrently with this application, and entitled "Modular All-Electrostatic Electron-Optical Column and Assembly of Said Columns Into an Array and Method of Manufacture", inventors D. M. Walker, A. P. Sliski, K. J. Harte and J. j. Carrona and assigned to Control Data Corporation. FIG. 3A and FIGS. 4A–4E, however, are believed to illustrate the fabrication of the novel single electron beam optical column in sufficient detail to enable one of ordinary skill in the electron beam optics art to practice the invention.

Electron Gun Assembly

The electron gun employed in the electron beam optical column in the preferred embodiment consists of a cathode 15, a control grid 16 and an anode 17. The electron gun is designed to provide a bright ($1-3 \times 10^5$ A/centimeter square/ster at 10 KV) stable and long lived (greater than 2000 operating hours) electron source. One suitable electron source for this purpose is described in co-pending U.S. application Ser. No. 749,787 filed June 28, 1985 concurrently with this application and entitled "Sapphire-Grided Flat Cathode Electron Gun"- J. Valun and K. J. Harte, inventors. For a more detailed description of the construction and operation of the electron gun, reference is made to this co-pending U.S. application Ser. No. 749,787. Other known cathode guns of comparable charactristics also could be used.

Figure 5:
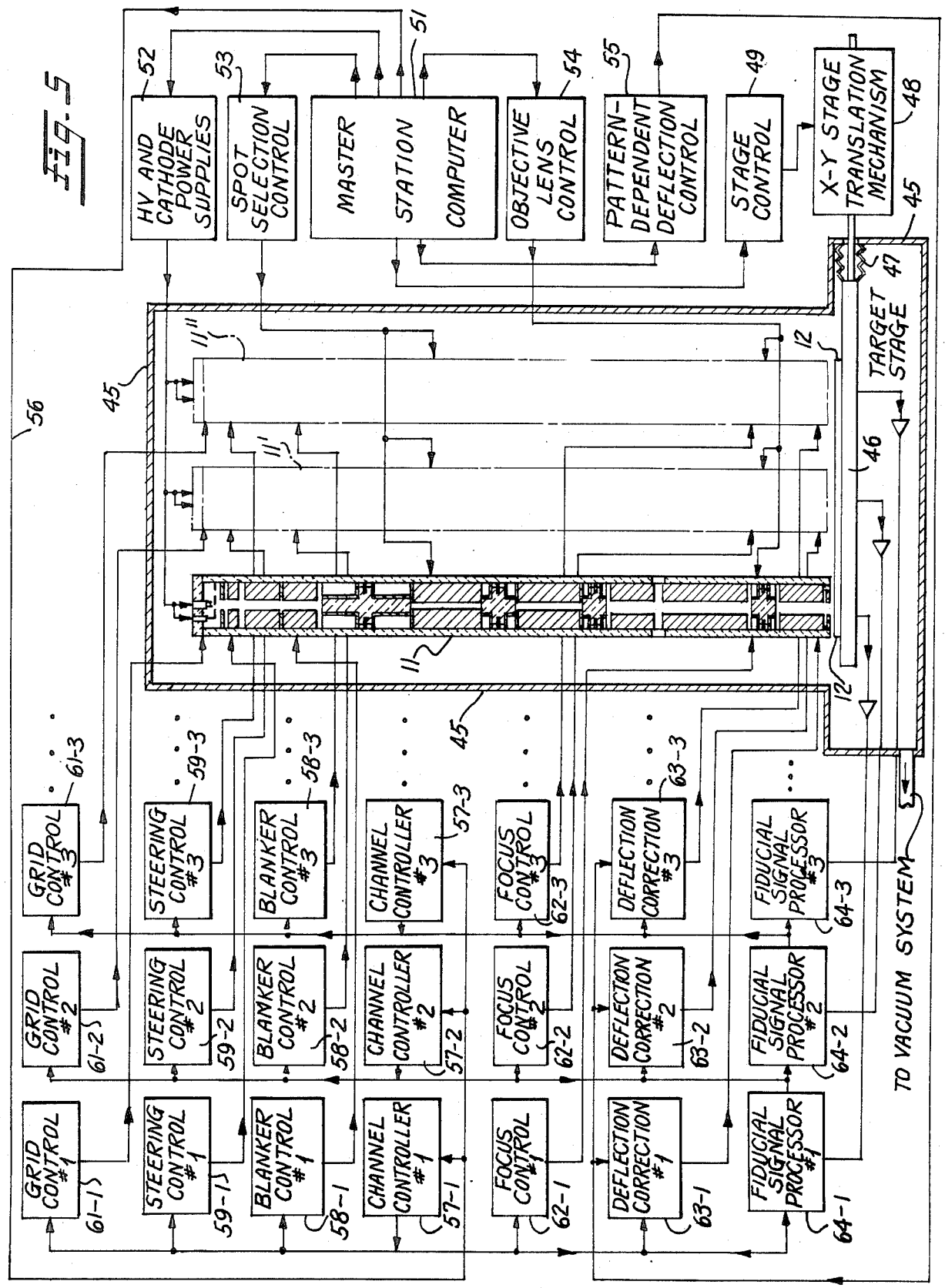
FIG. 5 is a functional block diagram showing the construction of the overall control system used for controlling a multiple channel electron beam optical column lithography system station according to the invention.

Also included in the electron gun sub-assembly is beam steering deflector 18 which consitutes a four-fold deflector that centers the electron beam supplied by the electron gun sections 15, 16 and 17 and causes the beam to enter the next section of the electron beam optical column along the undeflected center axis of the optical column indicated at 19. The beam steering deflector 18 compensates for any misalignment or stray magnetic fields present in the electron gun and eliminates the need for in situ mechanical adjustment of the electron beam optical column when mounting it in operating position as illustrated in FIGS. 1 and 5 of the drawings.

The electron gun sub-assembly is completed by an apertured plate 21 having a central circular aperture 21A therein as shown in FIG. 4A of the drawings and which is secured in housing 11 at the output end of the electron gun assembly. The aperture 21A in effect serves as a limiting aperture which limits the cross sectional area of the electron beam as it leaves the electron gun assembly.

Electron Beam Spot Size and Shaping Assembly

This sub-assembly provides a means for turning the electron beam on and off at high speed through the provision of a beam blanking deflector and blanking plate followed by an electron beam spot size and shaping section.

The beam blanking deflector includes a two-fold deflector comprised by a first deflector section 22 and a second deflector section 23 which upon application of a suitable blanking voltage pulse thereto causes the electron beam to be deflected out to and impinge upon a blanking apertured plate 25 having a central circular aperture 25A therein (FIG. 4C). Blanking in this manner is illustrated by the dotted line path 19B of the electron beam shown in FIG. 3B of the drawings. By this means, high speed turn-off of the electron beam can be achieved through the application of a blanking potential to the blanking deflector sections 22 and 23 and high speed turn-on of the beam is achieved by removal of the blanking potential whereby the electron beam will return to the path along its central, undeflected axis 19.

Spot size and shaping of the electron beam is achieved by a first spot shaping apertured plate 26 mounted along the longitudinal axis of the electron beam optical column between the beam blanking deflector sections 22 and 23 and having a square aperture opening 26A centrally located about the undeflected axis 19 of the electron beam path as shown in FIG. 4B. A desired electron beam spot size and shape is formed by imaging the square shaped aperture 26A of first plate 26 onto a desired one of a plurality of different shaped aperture openings 27A in a second imaged apertured plate 27. As best seen in FIG. 4D, apertured plate 27 has a plurality of different shape and different size apertured openings having configurations such as delta shaped openings, the deltas having different orientations, a central square opening and a plurality of circular openings of different diameters. The electron beam spot of a desired size and shape is formed by imaging the first imaged aperture 26A onto a desired one of the second imaged apertures 27A by means of two spot shaping lenses 28 and 29 and two spot shaping deflectors 31 and 32. The second imaged aperture 27A is in turn imaged onto the target surface 12 by the spot imaging and deflection sub-assembly to be described hereafter.

As shown in FIG. 4B, the first imaged aperture 26A comprises a single central square hole, while the second imaged aperture 27A may comprise either a square, a triangular hole of any desired orientation or a circular opening of a desired size required to fit a particular semiconductor device circuit pattern requirement. The spot size and shape is changed by deflecting the first imaged aperture 26A with the first spot shaping deflector 31 in a manner such that the image of the first imaged aperture 26A falls at a desired location on the second apertured plate 27, thereby reproducing truncated rectangles, or right isosceles triangles, or the like of any desired size and orientation up to a maximum size (typically 2.5 microns).

The second spot shaping deflector 32 restores the sized and shaped electron beam leaving the second imaged apertured plate 27 back to the central optical axis 19 thereby making the image of the first imaged apertured plate 26 (which now is partially truncated both in size and shape by the second imaged aperture 27A) to remain fixed along the central undeflected axis of the electron beam 19 relative to the workpiece or target 12. This is achieved by placing the two spot shaping deflectors 31 and 32 in conjugate image planes of lens 29, and avoids the need to correct the electron beam spot position as its size and/or shape is varied. Furthermore, by locating the first spot-shaping apertured plate 26 midway between the two equal length blanking deflector sections 22 and 23, motion of the electron beam spot position at the target 12 during blanking or unblanking is eliminated.

A more detailed description of the electron beam spot size and shaping assembly, including alternative configurations, is described in co-pending U.S. application Ser. No. 749,789, filed concurrently with this application and entitled "All-Electrostatic Electron-Optical Sub-System for Variable Electron Beam Spot Shaping and Method of Operation"—K. J. Harte and G. O. Langner, inventors and assigned to Control Data Corporation.

Electron Beam Spot Imaging and Deflection Assembly

The spot imaging and deflection sub-assembly serves to demagnify and focus the sized and shaped electron spot and to deflect it to a desired point within a 1-2 millimeter square field of view while keeping the deflected beam orthogonal to the plane of the target surface 12 at the deflected position thereby obviating the need for height adjustment to the beam. The beam spot imaging and deflection sub-assembly is comprised by a beam defining apertured plate 34 whose cross sectional configuration is shown in FIG. 4E of the drawings and which consititutes the limiting aperture of the electron beam optical system. The first active component following apertured plate 34 is a demagnification or condenser lens assembly 35 which comprises a three plate condenser lens element of conventional three-plate element lens design with the center plate at cathode potential. The purpose of this lens 35 is to achieve demagnification in two stages so as to allow shortening of the overall length of the electron beam column with its attendant advantages in size reduction for use in the lithography system.

Following the demagnifying condenser lens assembly 35 is a three-stage octopole deflector comprised by three octopole deflector sections 36, 37 and 38. The octopole deflector sections 36, 37 and 38 each are constructed and operate in a manner described more fully in U.S. Pat. No. 4,142,132 issued Feb. 27, 1979 for a "Method and Means for Dynamic Correction of Electrostatic Deflectors"—Kenneth J. Harte, inventor and assigned to the Control Data Corporation. For a more detailed description of the construction and operation of the three octopole deflector sections 36, 37 and 38, reference is made to U.S. Pat. No. 4,142,132, the disclosure of which is hereby incorporated into the disclosure of this application in its entirety. Briefly, however, it can be stated that the three octople deflector sections 36, 37 and 38 serve, in conjunction with an objective lens section 39 sandwiched between the second octopole deflector section 37 and the third octopole deflector section 38 as described hereafter, to deflect the sized and shaped electron beam to any desired position within a 1-2 millimeter field of view centered about the center axis postion 19 of the undeflected electron beam, and sequentially to straighten out the electron beam thus deflected so that it lands on the target surface 12 at the deflected position at an angle which is substantially orthogonal with the surface of target surface or workpiece 12. The effect achieved is depicted in the diagramatic sketch shown in FIG. 3B at 19D in which the effect has been somewhat exaggerated in order to be viewed by the reader. To achieve this objective, the three octopole deflector sections 36, 37 and 38 are alternately cross wired, as shown in Table 1 below, such that only eight external electrical connections are required for each electron beam optical channel.

TABLE 1

Voltages applied to each of eight blades on each of three deflector sections as a result of alternate cross-wiring.

| Blade No. | Deflector Section | | |
|---|---|---|---|
| | 1st (16) | 2nd (17) | 3rd (21) |
| 1 | $V_5$ | $V_1$ | $V_5$ |
| 2 | $V_6$ | $V_2$ | $V_6$ |
| 3 | $V_7$ | $V_3$ | $V_7$ |
| 4 | $V_8$ | $V_4$ | $V_8$ |
| 5 | $V_1$ | $V_5$ | $V_1$ |
| 6 | $V_2$ | $V_6$ | $V_2$ |
| 7 | $V_3$ | $V_7$ | $V_3$ |
| 8 | $V_4$ | $V_8$ | $V_4$ |

Blade Numbering Convention
(Looking from gun toward workpiece)

The deflection and correction voltages V1 through V8 are applied to the respective octopole deflector sections according to the method described in the above referenced U.S. Pat. No. 4,142,132 wherein the deflection voltages are applied antisymetrically around the octopole deflector, and the correction voltages are applied symetrically.

It is highly desireable for the deflection voltages to be subdivided into at least two levels: a relatively low-speed, high-accuracy (e.g. 5 microsecond, 16 to 18 bit) major field deflection, and a relatively high speed, low-accuracy (e.g. 50 nanosecond, 12 bit) minor field deflection. Major field deflection selects the desired subfield within the total deflection field of 1 to 2 millimeters, while minor field deflection selects the trapezoid being written and the individual electron beam spots within that trapezoid.

In the preferred embodiment, the minor field deflection voltage is electronically superimposed ("floated") onto the major field deflection voltage. Alternatively, the octopole deflector sections can each be physically subdivided into two electrically isolated parts; on one part the major field deflection voltage is applied, while on the other the minor field voltage is applied.

To achieve desired low aberration with the electron beam optical column, the lengths and spacing of the octopole deflector sections 36, 37 and 38 and the location of the objective lens assembly 39 must be chosen carefully and controlled accurately. To a first approximation the length of the second octopole deflector section 37 is twice the length of either the first section 36 or the third section 38, and the center of the objective lens assembly 39 is midway in the gap between the second deflector section 37 and the third deflector section 38. These conditions result in the central rays of an electron beam which enter the system on axis 19 to pass through the center of the objective lens 39, but at an angle proportional to the desired deflection and to exit the third octopole deflector section 38 the desired deflection distance but orthogonal to the surface of the workpiece 12. By keeping the electron beam substantially centered in the objective lens 39 in this manner, large off-axis lens aberration (coma) is avoided. Astigmatism in the lens, caused by the tilted deflected beam, is corrected by appropriate quadrupole deflector voltage applied to the octopole deflector sections 36, 37 and 38 as described more fully in the above referenced U.S. Pat. No. 4,142,132.

To achieve minimum aberration with the electron beam optical column, the objective lens 39 should be shifted slightly toward the target or workpiece 12, and the third octopole deflector section 38 made slightly shorter than the first octopole deflector section 36. The arrangement of the objective lens in this manner results in the unavoidable residual deflector aberration (coma) being substantially cancelled out by equal and opposite lens coma while the shortened final octopole deflector section 38 maintains orthogonal landing of the electron beam. Since both lens and deflector coma vary linearly with displacement, and since the angle the beam is deflected through in each octopole deflector section is very nearly proportional to the deflector voltage applied, low aberration, orthogonal landing conditions are maintained throughout the field of view of the electron beam optical column. In a similar manner, chromatic aberration from the deflector can be cancelled out by equal and opposite off-axis lens chromatic aberration. This method of correction to achieve minimum aberration has been verified by computer simulation.

As shown in FIG. 3A, the objective lens 39 comprises a three element lens and the configuration of the elements, particularly the center element which operates at high voltage, is chosen to minimize spherical aberration. By choosing both the length of the center element and the gaps between the center element and the two outer elements to be approximately equal to the diameter of the opening of the center element, a fairly low spherical aberration of about 20 times focal length can be achieved, which is adequate to meet design requirements of the system, namely a focused and deflected beam having a total aberration of the order of 0.1 micrometers and a current density of 15 to 50 amperes per centimeter square.

There is an additional function that the outer lens element of objective lens 39 must perform and that is to provide dynamic focus correction. The field of view of the deflector system comprised by the three octopole deflector sections 36, 37 and 38 is not flat, but parabolic. Thus a dynamic focus voltage must be generated which is proportional to the sum of the squares of the x and y deflection voltages applied to the octopole deflector sections 36, 37 and 38. In addition, it may be necessary to refocus dynamically as a function of spot size (as varied by the spot size and shaping assembly) because of electron-electron interactions in the beam. This electron-electron interaction effect varies approximately linearly with beam current (which is proportional to electron beam spot area).

The voltage required to accomplish dynamic focus correction is on the order of 1/100 of the cathode voltage. However, it is highly undesirable to superimpose such a small correction voltage onto a high voltage by adding it to the high voltage of the center element of the objective lens 39. Therefore, dynamic focus correction voltages are applied to the outer lens elements of objective lens 39 which normally are maintained at approximately ground potential. For a more detailed description of this technique of dynamic focus correction, reference is made to U.S. Pat. No. 4,338,548 issued July 6, 1982 for a "Unipotential Lens Assembly for Charged Particle Beam Tubes and Method for Applying Correction Potentials Thereto", assigned to the Control Data Corporation.

The last component included in the electron beam optical column 11 is a backscatter detector 41 mounted at the electron beam output end of the column for detecting electrons scattered from fiducial marks previously imposed on the target semiconductor wafer 12 being written upon in order to properly calibrate the electron beam positioning during writing of desired semiconductor device circuit patterns as described hereafter.

Operation of Multiple-Channel Electron Beam Lithography System

As noted earlier with respect to FIG. 1 of the drawings, all of the electron beam columns 11 positioned over the semiconductor target wafer 12 are operated simultaneously in parallel so that each channel covers a respective area. Electron beam writing is performed in a vector scan mode while the movable stage moves the selected target area for a particular electron beam channel beneath that channel. This action is best seen in FIGS. 1 and 2 of the drawings wherein, because of the limited (1-2 millimeter square) field of view of each channel, coverage of the entire target semiconductor wafer 12 surface is obtained by moving the stage upon which the target is supported continuously back and forth in tracks along the x-axis (for example) as best illustrated with respect to the channel 11A shown in FIG. 1. Simultaneously with the movement of the target wafer surface along the x-axis by the movable support carriage, the electron beam of each channel is deflected at right angles to the target surface motion, namely in the y direction where the x axis is defined as right and left in the plane of the drawings and the y axis is defined as orthogonal to the x axis namely from top to bottom of the Figure in the plane of the paper. At the end of each track of movement in the x direction, the movable support carriage for the target wafer 12 is stepped one track spacing (H) in the y direction until the entire square area S has been brought under the view of the particular electron beam channel 11A, for example, as well as the remaining eleven channels.

In order to control the above briefly described operation with sufficiently tight tolerances to meet the requirements for micro-circuit fabrication, the movable stage supporting the target wafer 12 must be monitored by a laser interferometer and control signals derived for feedback to control the stage movement x-y drive mechanism 48 (shown in FIG. 5) and the electron beam deflection plates in order to compensate for the continuous x motion and to correct for movable stage position errors. In addition, rotation of the movable stage (called yaw about the z axis perpendicular to the x-y plane as defined above) must be measured and feedback signals derived for use in deriving compensation signals also to be fed back to the deflection plates. This can be achieved either with an autocollimator or a laser interferometer. Since each electron beam channel is displaced by a different but known vector from the intersection of the x-y laser interferometer beam provided for this purpose, additional compensation must be provided in the deflection plate voltages supplied to the respective electron beam optical columns.

Because the design of the electron beam optical column provides orthogonal landing of the electron beams on the target wafer surface, no first order height correction is required in this system. This is in contrast to the system described in U.S. Pat. No. 4,390,789 noted above where the height of the workpiece below the electron beam column output has to be measured to within approximately 0.1 micrometers to avoid spot position error caused by the non-orthogonal landing of the electron beam on the target surface. Some height measurement or control is needed, however, to keep the electron beams in focus (depth of focus is about + or −3 micrometers). The most direct method for this purpose is the automatic focus of each channel either before exposure or during registration using fiducial marks placed in the chip boundaries of the semiconductor target wafer. Alternatively, a gauging method could be used such as optical or capacitance gauging.

Registration of the electron beam of each channel onto its appointed target area S of the semiconductor target wafer during writing is rendered difficult because of the small field of view of the respective electron optical column and the continuously moving stage supporting the target wafer. A preferred method for solving this problem is constituted by a two-step process as shown in FIG. 2 of the drawings. The first step of the process provides a starting correction before any electron beam writing takes place and is obtained by measuring the location of fiducial marks at three or four widely spaced points within the target area to be covered by the respective channel. These fiducial marks are shown as small solid squares indicated at 41 in FIG. 2. The second step of the process is to measure the location of the fiducial marks located on the wafer along the chip track scribe lines which are shown as small open squares identified as 42 in FIG. 2. Using these measurements, the channel controllers then correct each channel "on the fly" as the wafer is written.

The measurements obtained in the first step of the above briefly described two-step process are used to establish a set of coefficients (8 in all) which amongst other things correct for offset, rotation, gain and quadrilateral distortion in both the x and y directions. These correction signals then are supplied to the octopole deflector sections of the respective electron beam columns in order to correct the position of the electron beam relative to the assigned target area at the initiation of writing. Thereafter during writing, corrections for process-induced wafer distortions between electron-beam exposure and for rapid thermal expansion effects is obtained by using the measurements derived during the second step of the process.

An alternative registration method is to first measure the location of fiducial marks in the scribe lines (preferably at the corners) of the first row of chips (bottom row of 5 chips in FIG. 2). These measurements are then used to establish a set of correction in coefficients for each chip in the row. Then that row of chips is written with the beam corrected accordingly. Next, fiducial marks in the second row are measured (preferably using previous measurements of fiducial marks at the top of the first row where possible), and the process repeated to write the second row, and so forth through the entire field.

FIG. 5 is a functional block diagram of a suitable control system for the multiple channel electron beam lithography system. In FIG. 5 the system comprises a single station of 12 channels supported within an outer evacuated housing 45 that also includes a movable stage 46 on which the semiconductor target wafer 12 is physically supported beneath the array of single electron beam optical channels 11, 11', 11", etc., comprising the station in the manner shown in FIG. 1 of the drawings. The movable target supporting stage 46 is coupled through a flexible bellows 47 or other similar means for maintaining the integrity of the vacuum within housing 45 via a drive shaft to a x-y stage translation mechanism 48 of conventional, commercially available construction. X-y stage translation mechanism 48 is in turn controlled in its x-y movement by a stage control 49 that in turn is controlled by a master station computer shown at 51. Master station computer 51 also directly controls a common high voltage and cathode power supply circuit 52 for all of the electron beam columns 11, 11', 11" etc., as well as common spot selection control circuit 53, a common objective lens control circuit 54 and a common pattern dependent deflection control circuit 55, all of which commonly control the respective similar-named parts of the multiple electron beam optical columns.

In addition to the above, the master station computer 51 via conductor cable 56 directly controls each of the respective channel controllers shown at 57-1, 57-2 and 57-3.

For proper system operation, many functions must be provided separately for each electron beam channel. Such functions include the individual channel controler 57-1, 57-2, 57-3, etc. which in turn respectively directly control the beam blanker control circuitry 58-1, 58-2, 58-3, etc.; the beam steering control circuitry 59-1, 59-2, 59-3, etc.; the individual electron gun grid control circuitry 61-1, 61-2, 61-3, etc.; the focus control and correction circuitry 62-1, 62-2, 62-3, etc.; the deflection correction circuitry 63-1, 63-2, 63-3, etc.; and the fiducial signal processing circuitry 64-1, 64-2, 64-3, etc. for each of the individual electron beam optical columns 11, 11', 11", etc.

In order to reduce the data processing requirements of the improved lithography system, a pattern-data stripe buffer memory (not shown) is provided in the individual electron beam channel controllers 57-1, 57-2, 57-3, etc. This pattern-data stripe buffer memory is designed to store a particular part of the circuit pattern for each chip to be processed wherein each chip area is provided with a congruent stripe to be exposed as the stage is moved from one end of an x-axis track of movement to the other before being shifted one track space at the end of each track. With this arrangement, for example, with a 40 millimeter channel spacing (i.e. S=40 millimeters) and with individual chips being processed which are 4 millimeters long in the x direction, the same congruent stripe is written ten times per track By storing that congruent portion of the circuit pattern data in a fast buffer memory in the individual channel controller, the thru-put requirement from the pattern data disk controlling the pattern dependent deflection circuitry, can be reduced by a factor of ten.

FIG. 6 of the drawings is a functionl block diagram of an enlarged multi-channel electron beam lithography system according to the invention wherein there are a number of stations similar to that illustrated in FIG. 5 up to N station with each station having a number M of electron beam optical channels constructed according to the invention. In an enlarged system of this nature, an executive computer 65 is provided along with a complete pattern memory storing all of the semiconductor device circuit patterns to be written and which in turn communicates with and controls the operation of all of the N station computers 51 in the system. It should be also noted that a common stage control 49, common high voltage and cathode power supply circuitry 52 is provided under the control of both the executive computer 65 and the station computers 51 for all of the electron beam optical columns in each station and for all of the stations. In other respects, the system of FIG. 6 is similar to the system shown in FIG. 5 but illustrates how the multi-channel electron beam lithography system of FIG. 5 can be expanded into large microcircuit processing facilities.

INDUSTRIAL APPLICABILITY

The multiple channel electron beam lithography system and method described and claimed in this application has its principle commercial use in the fabrication of microminiaturized semiconductor circuit patterns by direct electron beam writing on discrete assigned surface areas of enlarged semiconductor wafer targets used in the fabrication of electronic microcircuits.

While a particular embodiment of the invention has been described with relation to the use of electrons, it is believed obvious to those skilled in the art that the system and teachings herein disclosed can be employed equally well with other charged particles such as positive or negative ions. In addition, while the embodiment of the invention has been described for use principally in charged particle lithography, because of the presence of the backscatter deflector 44, it also can be used for the readout of charged particle reflective or emissive target surfaces.

Having described several embodiments of a multiple channel charged particle beam lithography/readout system and method of oberation according to the present invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claim.

What is claimed is:

1. An electrostatic charged particle beam optical column for use in multi-channel charged particle beam lithography/readout systems comprising:
   (i) a charged particle gun mounted at one end of an elongated housing having a target surface supported at the opposite end;
   (ii) electrostatic charged particle beam spot shaping means mounted within said elongated housing in the direction of the target surface along the optical axis of the undeflected charged particle beam path of a charged particle beam produced by said charged particle gun;
   (iii) said electrostatic charged particle beam spot shaping means including first and second spot shaping apertured plate members separated by first spot shaping electrostatic deflector means for imaging the aperture of the first spot shaping apertured plate member onto the second spot shaping apertured plate member to thereby produce a partially truncated image of the aperture of the first spot shaping apertured plate for application to the target surface, and second spot shaping electrostatic deflector means following the second spot shaping apertured plate member for restoring the partially truncated charged particle beam image of the first spot shaping aperture back to the optical axis of the undeflected charged particle beam path to thereby avoid the need to correct the charged particle beam spot position at the target surface as the charged particle beam shape is varied;
   (iv) electrostatic condenser lens means positioned in said elongated housing intermediate the second spot shaping electrostatic deflector means and the target surface for demagnification of the shaped charged particle beam spot to allow for physically shortening the overall length of the electrostatic charged particle beam optical column;
   (v) shaped charged particle beam spot electrostatic deflector means mounted intermediate the electrostatic condenser lens means and the target surface;
   (vi) said shaped charged particle beam spot electrostatic deflector means comprising a three stage octopole deflector having first, second and third octopole deflector sections arrayed axially in the order named along the optical axis of the charged particle beam optical column and alternately supplied with deflection voltages and correction voltages; and
   (vii) objective lens means positioned ahead of the third and following the first and second octopole deflector sections whereby the central rays of the shaped charged particle beam as they enter the combined three stage octopole deflector and objective lens system in the path toward the target surface are caused by the first and second octopole deflector sections to pass through the center of the objective lens means at an angle proportional to the desired deflection, and thereafter pass through the third octopole deflector section and exit at a point spaced from the center axis of the undeflected charged particle beam path by a distance proportional to the desired deflection and on a path orthogonal to the target surface.

2. An electrostatic charged particle beam optical column according to claim 1 wherein;
   (viii) the proportion of the axial lengths of the first, second and third octopole deflector sections is such that the axial length of the second octopole deflector section is substantially twice the axial length of either the first or third octopole deflector sections, respectively; and
   (ix) the center of the objective lens means is midway in the axial gap between the second and third octopole deflector sections.

3. An electrostatic charged particle beam optical column according to claim 2 further including charged particle beam blanking deflection means and blanking apertured plate means mounted within the elongated housing between the charged particle gun and the electrostatic charged particle beam spot shaping means for selectively turning the charged particle beam produced by the charged particle beam column on and off when desired.

4. An electrostatic charged particle beam optical column according to claim 2 further including charged particle beam steering deflector means mounted in said elongated housing between the charged particle gun and the electrostatic charged particle beam spot shaping means for deflecting and centering the charged particle beam produced by the gun onto the optical axis of the charged particle optical column prior to entering the spot shaping means.

5. An electrostatic charged particle beam optical column according to claim 4 further including charged particle beam blanking deflection means and blanking apertured plate means mounted within the elongated housing between the gun and the electrostatic charged particle beam spot shaping means for selectively turning the charged particle beam produced by the column on and off when desired.

6. An electrostatic charged particle beam optical column according to claim 1 wherein said first spot shaping apertured plate member comprising a part of the electrostatic beam spot shaping electrode means has a single square aperture opening therein and said second spot shaping apertured plate member has a plurality of differently shaped and sized aperture openings therein for selectively truncating the charged particle beam cross-sectional are into a desired size and shape spot conforming to an input control deflection signal supplied to the first spot shaping electrostatic deflector means.

7. An electrostatic charged particle beam optical column according to claim 5 wherein said first spot shaping apertured plate member comprising a part of the beam spot shaping electrode means has a single square aperture opening therein and said second spot shaping apertured plate member has a plurality of differently shaped and sized aperture openings therein for selectively truncating the charged particle beam cross-sectional area into a desired size and shape beam spot conforming to an input control deflection signal supplied to the first spot shaping electrostatic deflector means.

8. An electrostatic charged particle beam optical column according to claim 2 wherein the objective lens is shifted slightly towards the target surface from its midgap position and the third octopole deflector section is slightly shorter in axial length than the axial length of the first octopole deflector section.

9. An electrostatic charged particle beam optical column according to claim 7 wherein the objective lens is shifted slightly towards the target surface from its midgap position and the third octopole deflector section is slightly shorter in axial length than the axial length of the first octopole deflector section.

10. An electrostatic charged particle beam optical column according to claim 2 wherein the objective lens means comprises a three element lens having a center element operated at high voltage and the two outer elements operated at low voltages to which dynamic focus correction potentials are supplied during operation with the axial length of the center lens element and the spacing between the two outer lens elements being approximately equal to the center lens element opening diameter.

11. An electrostatic charged particle beam optical column according to claim 9 wherein the objective lens means comprises a three element lens having a center element operated at high voltage and the two outer elements operated at low voltages to which dynamic focus correction potentials are supplied during operation with the axial length of the center lens element and the spacing between the two outer lens elements being approximately equal to the center lens element opening diameter.

12. An electrostatic charged particle beam optical column according to claim 2 wherein the electrostatic condenser lens means is mounted immediately following a beam limiting aperture plate at the outlet end of the second spot shaping deflector means and comprises a three plate element Einzel lens with the center plate at cathode potential.

13. An electrostatic charged particle beam optical column according to claim 11 wherein the electrostatic condenser lens means is mounted immediately following beam limiting aperture plate at the outlet end of the second spot shaping deflector means and comprises a three plate element Einzel lens with the center plate at cathode potential.

14. An electrostatic charged particle beam optical column according to claim 1 further including backscatter detector means mounted at the end of the elongated housing immediately adjacent the target surface for detecting charged particles scattered from fiducial marks on the target and deriving control signals therefrom for use in controlling operation of the optical column.

15. An electrostatic charged particle beam optical column according to claim 13 further including backscatter detector means mounted at the end of the elongated housing immediately adjacent the target surface for detecting charged particles scattered from fiducial marks on the target and deriving control signals therefrom for use in controlling operation of the optical column.

16. An electrostatic charged particle beam optical column according to claim 1 wherein the target surface is mounted on a movable stage that is movable in two orthogonal axes transverse to the optical axis of the optical column and the shaped beam spot electrostatic deflector means deflects the shaped charged particle beam spot in a dimension transverse to the axis of movement of the movable stage and the optical axis of the charged particle beam optical column.

17. An electrostatic charged particle beam optical column according to claim 15 wherein the target surface is mounted on a movable stage that is movable in two orthogonal axes transverse to the optical axis of the charged particle beam optical column and the shaped charged particle beam spot electrostatic deflector means deflects the shaped beam spot in a dimension transverse to one axis of movement of the movable stage and the optical axis of the charged particle beam optical column.

18. A multiple channel charged particle beam optical column lithography/readout system comprising a plurality of single beam all-electrostatic charged particle optical columns each of which has its single charged particle beam controllably deflected within a limited planar field of view, said charged particle optical columns being mounted in a common evacuated housing that supports all the optical columns over selected unique areas of a common target surface with the undeflected and deflected charged particle beam path optical axes of all the optical columns arranged in parallel with each other and orthogonal to the target surface, said single beam charged particle optical columns each including electrostatic deflector means supplied with deflection voltages and correction voltages for deflecting its respective charged particle beam within a limited palanar field of view that is orthogonal to the underdeflected charged particle beam axis and a desired distance from the charged particle beam optical axis and to bend the deflected beam back onto a path that is parallel to the optical axis and orthogonal to the target surface but spaced from the optical axis the desired deflection distance, and movable stage means physically supporting the common target surface at the beam output ends of the optical columns with the unique target areas adjacent the beam output end of their respective optical columns, and means for controllably moving the movable stage means along at least one axis of movement that is transverse to the undeflected beam optical axes of the plurality of optical columns.

19. A multiple channel charged particle beam optical column lithography/readout system according to claim 18 further including control system means for controlling the charged particle beam lithography performed on the selected target areas of the common target surface by the multiple charged particle beam optical columns; said control system means including a master control sub-system common to all the optical columns and comprising a master system control computer, common high voltage and gun power supplies, common spot selection control means, common pattern-dependent deflection control means, common objective lens and dynamic focus control means and a master movable stage monitoring and control means; and said control system means further including a plurality of individual channel controller sub-systems for individually controlling each channel in accordance with the unique operating characteristics of the individual channels and comprising individual channel controllers, individual channel beam blanking controllers., individual channel beam steering controllers, individual grid control circuitry for the respective guns, individual focus control and correction circuitry, individual channel cnannel deflection correction circuitry, and individual channel fiducial signal processing circuitry.

20. A multiple channel charged particle beam optical column lithography/readout system according to claim 19 wherein each individual charged particle beam optical column comprises:
  (i) a charged particle gun mounted at one end of an elongated housing having a target surface supported at the opposite end;
  (ii) electrostatic charged particle beam spot shaping means mounted within said elongated housing in the direction of the target surface along the optical axis of the undeflected beam path of a charged particle beam produced by said gun;
  (iii) said electrostatic charged particle beam spot shaping means including first and second spot shaping apertured plate members separated by first spot shaping electrostatic deflector means for imaging the aperture of the first spot shaping apertured plate member onto the second spot shaping apertured plate member to thereby produce a partially truncated image of the aperture of the first spot shaping apertured plate for application to the target surface, and second spot shaping electrostatic deflector means following the second spot shaping apertured plate member for restoring the partially truncated image of the first spot shaping aperture back to the optical axis of the undeflected beam path to thereby avoid the need to correct the beam spot position at the target surface as the beam shape is varied;
  (iv) electrostatic condenser lens means positioned in said elongated housing intermediate the second spot shaping electrostatic deflector means and the target surface for demagnification of the shaped charged particle beam spot to allow for physically shortening the overall length of the electrostatic charged particle beam optical column;
  (v) the charged particle beam electrostatic deflector means being mounted intermediate the electrostatic condenser lens means and the target surface;
  (vi) said charged particle beam spot electrostatic deflector means comprising a three stage octopole deflector having first, second and third octopole deflector sections arrayed axially in the order named along the optical axis of the charged particle beam optical column and alternately supplied with deflection voltages and correction voltages; and
  (vii) objective lens means positioned ahead of the third and following the first and second octopole deflector sections whereby the central rays of the shaped charged particle beam as they enter the combined three stage octopole deflector and objective lens system in the path toward the target surface are caused by the first and second octopole deflector sections to pass through the center of the objective lens means at an angle proportional to the desired deflection, and thereafter pass through the third octopole deflector section and exit at a point spaced from the center axis of the undeflected beam path by a distance proportional to the desired deflection and on a path orthogonal to the target surface.

21. A system according to claim 20 wherein
  (viii) the proportion of the axial lengths of the first, second and third octopole deflector sections is such that the axial length of the second octopole deflector section is substantially twice the axial length of either the first or third octopole deflector sections, respectively; and
  (ix) the center of the objective lens means is midway in the axial gap between the second and third octopole deflector sections.

22. A system according to claim 21 further including charged particle beam blanking deflection means and blanking apertured plate means mounted within the elongated housing between the charged particle gun and the electrostatic charged particle beam spot shaping electrode means for selectively turning the beam produced by the charged particle beam column on and off when desired.

23. A system according to claim 22 further including beam steering deflector means mounted in said elongated housing between the gun and the electrostatic beam spot shaping means for deflecting and centering the charged particle beam produced by the gun onto the optical axis of the charged particle optical column prior to entering the spot shaping electrode means.

24. A system according to claim 23 wherein said first spot shaping apertured plate member comprising a part of the electrostatic beam spot shaping means has a single square aperture opening therein and said second spot shaping apertured plate member has a plurality of differently shaped and sized aperture openings therein for selectively truncating the charged particle beam cross-sectional area into a desired size and shape beam spot conforming to an input control deflection signal supplied to the first spot shaping electrostatic deflector means.

25. A system according to claim 24 wherein the objective lens is shifted slightly towards the target surface from its midgap position and the third octopole deflector section is slightly shorter in axial length than the axial length of the first octopole deflector section.

26. A system according to claim 25 wherein the objective lens means comprises a three element lens having a center element operated at high voltage and the two outer elements are operated at low voltages to which dynamic focus correction potentials are supplied during opertion with the axial length of the center lens element and the spacing between the two outer lens elements being approximately equal to the center lens element opening diameter.

27. A system according to claim 26 wherein the electrostatic condenser lens means is mounted immediately following a beam limiting aperture plate at the outlet end of the second spot shaping deflector means and comprises a three plate element Einzel lens with the center plate at cathode potential.

28. A system according to claim 27 further including backscatter detector means mounted at the end of the elongated housing immediately adjacent the target surface for detecting charged particles scattered from fiducial marks on the target and deriving control signals therefrom for use in controlling operation of the charged particle beam optical column.

29. An electrostatic charged particle beam optical column for use in charged particle beam lithography/readout systems comprising:
 (i) a charged particle gun mounted at one end of an elongated housing having a target surface supported at the opposite end;
 (ii) charged particle beam electrostatic deflector means mounted intermediate the charged particle gun and the target surface; and
 (iii) said charged particle electrostatic deflector means being supplied with deflection voltages and correction voltages for deflecting the charged particle beam within a limited planar field of view that is orthogonal to its undeflected charged particle beam axis and a desired distance from the charged particle beam optical axis and to bend the deflected beam back onto a path that is parallel to the optical axis and orthogonal to the target surface but spaced from the optical axis the desired deflection distance.

30. The method of operating a multiple channel charged particle beam optical column lithography/readout system comprised by a plurality of single electron beam optical columns mounted in a common evacuated housing structure that supports all the optical columns over selected unique areas of a common target surface with the undeflected beam path optial axes of all the optical columns arranged in parallel with each other and orthogonal to the target surface, each of the optical columns comprising charged particle electrostatic deflector means for deflecting the respective charged particle beams thereof within a limited planar field of view that is orthogonal to the deflected and undeflected charged particle beam axis and a desired distance from the charged particle beam optical axis, electrostatic charged particle beam spot shaping means mounted in each optical column in advance of the electrostatic deflector means along the optial axis of the undeflected charged particle beam for partially truncating the cross-sectional area of the charged particle beam to provide a desired size and shape beam spot at the target surface and for restoring the charged particle beam path back to the optical axis of the optical column in advance of the beam entering the electrostatic deflector means, movable stage means physically supporting the common target surface at the output ends of the charged particle beam optical columns with the unique target areas adjacent the beam output end of their respective charged particle beam optical columns, and means for controllably moving the movable stage means along at least two axes of movement that are transverse to the undeflected beam optical axes of the plurality of optical columns and further including control system means for controlling tne charged particle beam lithography/readout performed on selected target areas of the common target surface by the multiple charged particle beam optical columns; said method comprising mounting a large diameter semiconductor wafer as the target surface on the movable stage with preselected surface areas of the target wafer being disposed under the charged particle beam output end of respective ones of the plurality of optical columns and evacuating the common evacuated housing structure for all of the columns; charged particle beam writing/reading on each of the preselected surface areas the same pattern for all areas of the target wafer; operating the charged particle beam optical columns in parallel using a master pattern deflection control common to all of the optical columns under the control of a master control computer; commonly controlling all of the electrostatic deflector means and the electrostatic charged particle beam spot-shaping means of the optical columns; coordinating said charged particle beam writing/reading with movement of the selected target wafer areas by the movable stage means supporting the target wafer under the control of the master control computer to achieve a vector scan write/read-on-the-fly mode of charged particle beam writing/reading within the deflection field of view of the respective optical columns; writing the common pattern on the respective target areas which are broken into a plurality of discrete different size areas; and dynamically adjusting in the write/read-on-the-fly mode each sasid discrete area on the charged particle beam spot size and shape of each optical column so as to accomplish writing/reading on the selected target areas of the target wafer in a minimum of time.

31. The method according to claim 30 wherein certain control functions are shared in common across all of the channels including the master system control computer, high voltage and gun power supply, spot selection control, pattern-dependent deflection control, dynamic focus control and movable stage movement monitoring and control; and wherein other control functions are supplied separately to the individual columns including separate beam channel control by a unique beam channel controller for each charged particle beam channel, beam blanking control for each respective channel, beam steering control for each channel, gun grid control for each respective channel, beam spot focus control and correction for each channel, beam deflection correction for each channel, and fiducial signal sensing and processing for each respective channel.

32. The method according to claim 31 wherein the optic elements of each charged particle beam optical column including the focus and deflection elements are all electrostatic and capable of covering a one to two millimeter square field of view with a focused beam having a current density of the order of 15 to 50 A/cm² at 10 KV for an operating life of the order of 2000 hours.

33. The method according to claim 31 wherein the deflection field of view of the charged particle beam optical columns is relatively limited of tne order of one to two square millimeters and coverage of the target wafer selected surfaces is obtained by moving the movable stage supporting the target wafer continuously back and forth in tracks along a first axis of movement while simultaneously deflecting the charged particle beam along a second axis of movement orthogonal to the first and moving the movable stage one track spacing equal to the deflection field width along the second axis of movement at the end of each track.

34. The method according to claim 33 further including monitoring motion of the movable stage along both the first and second axes of movement, and deriving and feeding back to the beam deflection section compensation signals to compensate for the continuous motion along the first axis of movement over each sub-field and to correct for stage position errors.

35. The method according to claim 34 further including measuring movable stage yaw about the Z-axis orthogonal to the plane of the movable stage and deriving a feedback yaw correction signal for supply to the beam deflection section of each charged particle beam channel.

36. The method according to claim 31 wherein charged particle beam registration within each charged particle beam channel is separately achieved under the control of the unique channel controller for a particular charged particle beam channel by starting registration correction before writing/reading is commenced, first by measuring the location of fiducial marks placed at three or four widely spaced points within an area to be covered by each channel, second by measuring the location of fiducial marks formed on the target surface of the wafer in prescribed chip scribe lines, deriving registration correction signals from the measurements thus obtained, and correcting registration of the beam produced by each channel on the fly as each wafer target surface area is written/read by establishing a set of coefficients from the first measurements which correct for offset, rotation, gain and quadrilateral distortion along the first and second (X, Y) axes of movement within the plane of the target surface and thereafter updating the coefficients on the fly during writing/reading with the use of the second measurements to thereby correct for process induced wafer distortions between beam exposures and for rapid thermal expansion effects.

37. The method according to claim 35 wherein charged particle beam registration within each charged particle beam channel is separately achieved under the control of the unique channel controller for a particular charged particle beam channel by starting registration correction before writing/reading is commenced, first by measuring the location of fiducial marks placed at three or four widely spaced points within an area to be covered by each channel, second by measuring the location of fiducial marks formed on the target surface of the wafer in prescribed chip scribe lines, deriving registration correction signals from the measurements thus obtained, and correcting registration of the beam produced by each channel on the fly as each wafer target surface area is written/read by establishing a set of coefficients from the first measurements which correct for offset, rotation, gain and quadrilateral distortion along the first and second (X, Y) axes of movement within the plane of the target surface and thereafter updating the coefficients on the fly during writing/reading with the use of the second measurements to thereby correct for process induced wafer distortions between beam exposures and for rapid thermal expansion effects.

38. An electrostatic charged particle beam optical column for use in charged particle lithography/readout systems according to claim 29 wherein
(iv) said charged particle beam electrostat deflector means comprises a three stage octopole deflector having first, second and third octopole deflector sections arrayed axially in the order named along the optical axis of the charged particle beam optical column and alternately supplied with deflection voltage and correction voltages; and
(v) objective lens means positioned ahead of the third and following the first and second octopole deflector sections whereby the central rays of tne shaped beam as they enter the combined three stage octopole deflector and objective lens system in the path toward the target surface are caused by the first and second octopole deflector sections to pass through the center of the objective lens means at an angle prportional to the desired deflection, and thereafter pass through the third octopole deflector section and exit at a point spaced from the center axis of the undeflected beam path by a distance proportional to the desired deflection and on a path orthogonal to the target surface.

39. An electrostatic charged particle beam optical column according to claim 38 further including
(vi) electrostatic charged particle beam spot shaping means mounted within said elongated housing intermediate the electron gun and the electrostatic deflector means along the optical axis of the undeflected particle beam for partially truncating the cross-sectional area ofthe charged particle beam to provide a desired size and shape beam spot at the target surface and for restoring the charged particle beam path back to the undeflected optical axis of the optical column prior to entering the electrostatic deflector means to thereby avoid tne heed to correct the charged particle beam spot position at the target surface as the beam shape is varied; and
(vii) electrostatic condenser lens means positoned in said elongated housing intermediatee the electrostatic beam spot shaping means and th target surface for demangification of the shaped beam spot to allow for physically shortening the overall length of the electrostatic charged particle beam optical column.

* * * * *